США006555886B1

United States Patent
Xu et al.

(10) Patent No.: US 6,555,886 B1
(45) Date of Patent: Apr. 29, 2003

(54) DEVICE HAVING TWO PEROVSKITE CRYSTALLINE LAYERS THAT SHOWS HYSTERESIS AND PIEZOELECTRIC BEHAVIOR

(75) Inventors: Chaonan Xu, Tosu (JP); Tadahiko Watanabe, Saga (JP); Yun Liu, Tosu (JP); Morito Akiyama, Tosu (JP)

(73) Assignee: Agency of Industrial Science and Technology, Tokyo-To (JP)

( * ) Notice: Subject to any disclaimer, the term of this patent is extended or adjusted under 35 U.S.C. 154(b) by 0 days.

(21) Appl. No.: 10/053,606

(22) Filed: Jan. 24, 2002

Related U.S. Application Data

(63) Continuation of application No. 09/472,023, filed on Dec. 27, 1999, now abandoned.

(30) Foreign Application Priority Data

Sep. 3, 1999 (JP) ............................................. 11-249808

(51) Int. Cl.[7] ................................................. H01G 4/06
(52) U.S. Cl. ........................ 257/410; 257/52; 257/295
(58) Field of Search .......................... 257/52, 410–411, 257/415–417, 295; 438/216, 281, 261, 287, 421, 482, 591, 595, 957, 981

(56) References Cited

U.S. PATENT DOCUMENTS

| | | | | |
|---|---|---|---|---|
| 5,563,764 A | * | 10/1996 | Arakawa et al. | ............ 361/304 |
| 5,798,903 A | * | 8/1998 | Dhote et al. | ............. 361/321.4 |
| 6,001,416 A | | 12/1999 | Moriyama et al. | |

FOREIGN PATENT DOCUMENTS

| | | |
|---|---|---|
| JP | 7-133198 | 5/1995 |
| JP | 10-93036 | 4/1998 |
| JP | 10-121233 | 5/1998 |

* cited by examiner

*Primary Examiner*—Minh Loan Tran
*Assistant Examiner*—Thomas L Dickey
(74) *Attorney, Agent, or Firm*—Wenderoth, Lind & Ponack, L.L.P.

(57) ABSTRACT

Disclosed is an electronic device having a multilayered structure consisting of (a) a substrate, (b) an electroconductive layer of lanthanum nickel oxide $LaNiO_3$ having a perovskite structure formed on the substrate surface and (c) a dielectric layer of PZT having an oriented perovskite structure formed on the electroconductive layer. The device exhibits excellent piezoelectric effect under mechanical stress and stable hysteresis phenomenon of electric polarization under application of electric fields so that the device is useful as a stress sensor and as a memory device. A method for the preparation of the multilayered device is disclosed.

8 Claims, 5 Drawing Sheets

DEVICE HAVING TWO PEROVSKITE CRYSTALLINE LAYERS THAT SHOWS HYSTERESIS AND PIEZOELECTRIC BEHAVIOR

This application is a continuation of application Ser. No. 09/472,023, filed Dec. 27, 1999, now abandoned.

BACKGROUND OF THE INVENTION

The present invention relates to a multilayered electronic device which is useful as a stress sensor element or memory device.

It is well known that certain composite oxides consisting of the oxides of lead, zirconium and titanium as the principal constituents having a perovskite structure, referred to as a lead zirconate titanate (PZT) perovskite material hereinafter, exhibit, when oriented, excellent piezoelectric and dielectric properties so that development works are now under way for the utilization of such PZT perovskite materials as a variety of electronic devices such as stress sensors and memory devices.

Such an electronic device is prepared usually by forming a layer of the PZT perovskite compound on the surface of a single-crystalline substrate having a platinum electrode layer deposited thereon beforehand by sputtering of the component compounds necessary to form the PZT perovskite compound. It is a difficult matter to form an oriented film on a polycrystalline substrate. Since a plurality of components must be involved in the target materials for this sputtering process, a difficulty is encountered in obtaining a fully oriented film of the perovskite compound having a pseudocubic crystalline structure of which the lengths of the a-axis and c-axis are close each to the other, especially, on a polycrystalline substrate. In addition, lead as one of the principal constituents of the PZT perovskite material is liable to cause sublimation and has corrosiveness so that long-term stability can hardly be ensured in a memory device by utilizing the PZT perovskite material due to denaturation of the perovskite material and corrosion on the metallic electrodes.

SUMMARY OF THE INVENTION

The present invention accordingly has an object to provide a novel multilayered electronic device having long-term stability of which the working element has a multilayered structure of a PZT perovskite as formed with orientation on a substrate material which is not particularly limitative including single crystal materials as well as polycrystalline ceramic materials and amorphous materials and also to provide a method for the preparation of such a multilayered electronic device.

Thus, the multilayered electronic device of the present invention is an integral body which comprises a three-layered structure consisting of layers (a), (b) and (c), a vertical cross-section of which is depicted in FIG. 8, said layers being:

(a) a substrate of a single-crystalline material, ceramic material, metallic material or amorphous material;
(b) an electroconductive layer formed on the surface of the substrate having a crystalline structure, preferably, of a perovskite of lanthanum nickel oxide $LaNiO_3$; and
(c) a dielectric layer formed on the electroconductive layer having an oriented crystalline structure of a perovskite of, preferably, lead zirconate titanate PZT.

The multilayered structure formed on the surface of a substrate can be an alternate repetition of a multiplicity of the electroconductive $LaNiO_3$ perovskite layers and a multiplicity of the dielectric. PZT perovskite layers.

The above defined multilayered electronic device can be prepared by a method which comprises the steps of:

(A) forming the layer of $LaNiO_3$ on the surface of the substrate by
  (A1) coating the surface of the substrate with an aqueous coating solution containing a water-soluble thermally decomposable lanthanum compound and a water-soluble thermally decomposable nickel compound to form a coating layer, and
  (A2) subjecting the coating layer formed in step (A1) to a heat treatment in an oxidizing atmosphere to convert the lanthanum and nickel compounds into an electroconductive layer of a $LaNiO_3$ perovskite;

(B) forming a dielectric layer consisting of PZT on the electroconductive layer to form a multilayered structure; and (C) subjecting the multilayered structure formed in step (B) to a heat treatment at a temperature in the range from 300 to 800° C. in an inert atmosphere to convert the layer into an oriented PZT perovskite layer.

The above described step (A) for the formation of the electroconductive $LaNiO_3$ layer and the steps (B) and (C) for the formation of a dielectric oriented PZT perovskite layer can be repeated alternately as many times as desired to prepare a multilayered electronic material having alternate repetition of the electroconductive and dielectric layers.

DETAILED DESCRIPTION OF THE PREFERRED EMBODIMENTS

Figure 1:
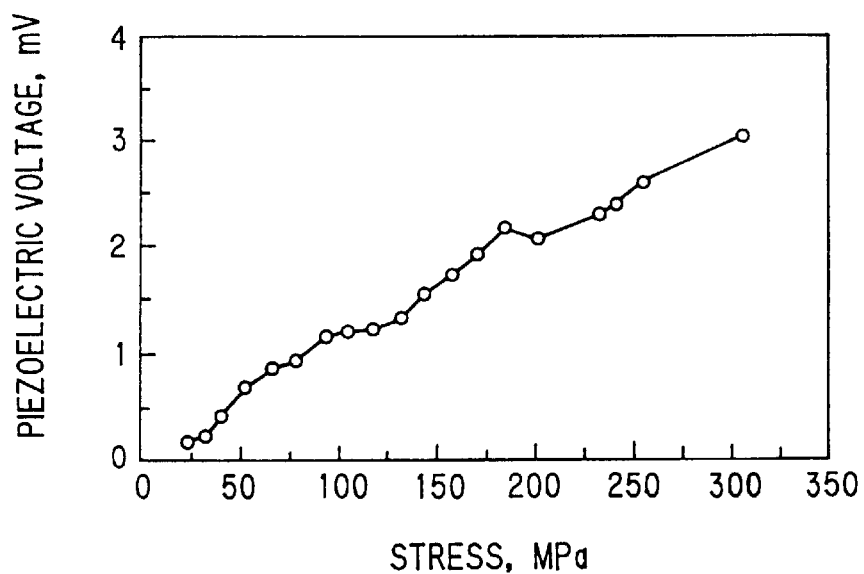
FIGS. 1 and 2 are each a graph showing the piezoelectric voltages generated in a $PZT/LaNiO_3/SiC$ multilayered body and a $PZT/LaNiO_3$/glass multilayered body, respectively, tested in Example 2 as a function of the stress therein.

The above described multilayered electronic device and the method for the preparation thereof have been established as a result of the inventors' extensive investigations undertaken on the base of their discovery that the long-term stability of the multilayered body as an electronic device can be ensured when a substrate is first provided with an electroconductive coating layer of a specific perovskite compound on the surface and then with an oriented dielectric layer of a specific perovskite compound on the electroconductive layer. The layered structure can be formed even on an amorphous or polycrystalline substrate.

Namely, the substrate material on which the multilayered structure is formed according to the invention is not particularly limited to a single crystal material but can be selected from a wide range of materials including, in addition to single crystals of silicon and alumina as are conventional in the prior art, amorphous materials such as optical glass and fused silica glass, metallic materials such as stainless steel and nickel and sintered ceramic materials of alumina, silicon nitride, silicon carbide and the like.

In the inventive electronic device, the first layer to be formed on the surface of the substrate must be an electroconductive layer of a specific perovskite compound which is preferably a lanthanum nickel oxide of the formula $LaNiO_3$. This specific perovskite compound is advantageous because high crystallinity and good orientation can be accomplished in the dielectric layer of a specific perovskite compound to be formed thereon according to the inventive method.

The electroconductive layer of a perovskite compound can be formed by a variety of methods but the most typical and convenient method is as follows. Namely, the surface of the substrate is coated with an aqueous coating solution containing water-soluble compounds of the constituent elements or, in this case, a water-soluble lanthanum compound, such as lanthanum acetate, and a water-soluble nickel compound, such as nickel nitrate, which can be thermally decomposed to form the respective oxides by a heat treatment in an oxidizing atmosphere.

The concentrations of these water-soluble compounds of, for example, lanthanum and nickel in the aqueous coating solution should be such as to correspond to 0.01 to 1.0% by moles calculated as the electroconductive perovskite compound, e.g., $LaNiO_3$.

Though optional, it is preferable that the aqueous coating solution mentioned above contains a water-soluble polymeric compound such as polyvinyl alcohol to serve as a binder. The aqueous coating solution is uniformly applied to the substrate surface by a conventional coating method such as the method of spin coating followed by a heat treatment in an atmosphere of an oxidizing gas such as oxygen at a temperature in the range from 400 to 800° C. so that the lanthanum and nickel compounds are converted into a composite oxide of a perovskite structure forming a layer on the substrate surface. While the thickness of the perovskite conductive layer formed by undertaking a single coating and a single heat treatment usually has a thickness of 10 to 100 nm, it is optional according to need to repeat several times of the coating and heat treatment in order to obtain a desired thickness of the conductive layer.

In the preparation of the inventive electronic material, the above described step for the formation of an electroconductive perovskite layer on the substrate surface is followed by a step for the formation of a so-called PZT dielectric material of a perovskite structure mainly consisting of lead (Pb), zirconium (Zr) and titanium (Ti).

The dielectric layer of the PZT perovskite can be formed by the so-called sol-gel method or by the sputtering method, of which the sputtering method is particularly suitable for the formation of an oriented perovskite layer. The thus formed PZT dielectric layer on the electroconductive layer is then subjected to a heat treatment at a temperature of 300 to 800° C. in an atmosphere of argon under a pressure of 0.1 Pa to 0.1 MPa for at least 30 minutes with an object to improve crystallinity and orientation of the layer.

The conditions in the above mentioned procedure for the formation of the PZT dielectric layer should be optimized depending on the material of the substrate in order to improve the crystallinity and orientation of the layer. When a substrate made from an alumina ceramic is used, for example, the substrate temperature should be relatively low at about 400° C. while, when the substrate is made from a silicon nitride or silicon carbide ceramic, the temperature should be increased to about 690° C.

The multilayered structure of the inventive electronic device is formed by alternately repeating the above described procedure for the formation of the electroconductive perovskite layer and the procedure for the formation of the dielectric PZT perovskite layer as many times as desired.

Each of the electroconductive perovskite layer and the dielectric PZT perovskite layer in the inventive multilayered electronic device works in a different way from the other. For example, the electroconductive perovskite layers of $LaNiO_3$ have electroconductivity so that each of them serves as an electrode while the dielectric PZT layers have ferroelectricity to serve as a non-volatile memory element. Since the electroconductive layer of $LaNiO_3$ and the dielectric PZT layer both have a perovskite structure, the multilayered electronic device of the invention consisting of alternate repetition of these two types of layers formed on a variety of substrate materials has excellent anti-fatigue characteristic to exhibit stability over a long term of service.

Since the dielectric PZT layer is an oriented layer, the layer exhibits piezoelectricity under a compressive stress without any poling process so that, when the piezoelectric voltages induced in the dielectric layer are measured with the electroconductive $LaNiO_3$ layers as one of the electrodes, the multilayered electronic device of the invention serves as a sensor for detecting the compressive stress added to the device. Namely, the multilayered electronic device such as $PZT/LaNiO_3$/substrate by itself can detect the condition of stress in the device per se to conduct self-diagnosis of the stressed condition so that the device will find applicability in a wide variety of fields including the service as an intelligent material.

In the following, the present invention is described in more detail by way of Examples.

EXAMPLE 1

Two aqueous solutions were prepared by dissolving lanthanum acetate and nickel nitrate in deionized water in such relative amounts corresponding to the stoichiometric composition of $LaNiO_3$ and the aqueous solutions were mixed together followed by the addition of a polyvinyl alcohol in an amount of 0.5% by weight based on the overall amount of the aqueous solution. The aqueous solution was further diluted by adding water to give an aqueous coating solution in which the concentrations of the lanthanum and nickel salts corresponded to 0.5% by moles calculated as $LaNiO_3$.

Substrate plates of semiconductor silicon, crystallized glass, ceramics of silicon carbide, alumina and silicon nitride, optical glass, fused silica glass, stainless steel and nickel were each coated with the above prepared coating solution on a spin coater rotating at 2000 rpm followed by a baking treatment at 500° C. in an atmosphere of oxygen to form a layer of $LaNiO_3$ which had a thickness 50 nm. The above described procedure including-coating with the coating solution and baking of the coating layer was repeated several times until the overall thickness of the conductive LaNiO$_3$ layer of the perovskite structure had reached 150 nm.

In the next place, a dielectric PZT layer of 1 μm thickness was formed on the LaNiO$_3$ conductive layer formed in the above described manner by the radiofrequency magnetron sputtering method using a target of sputtering of which the content of lead was in excess of 0.15% by moles over the composition of the desired PZT layer while keeping the substrate at a temperature of 600° C. followed by a heat treatment at 600° C. for 3 hours in an atmosphere of argon under a pressure of 1 Pa to form a dielectric PZT layer of the perovskite structure.

Thus, electronic devices with different substrate materials were obtained each bearing an electroconductive layer of a LaNiO$_3$ perovskite structure and a dielectric layer of a PZT perovskite structure having good orientation which was particularly good in the layer formed on the alumina ceramic substrate.

COMPARATIVE EXAMPLE

A dielectric PZT layer of the perovskite structure having a thickness of 1 μm was formed in the same sputtering method as in Example 1 directly on the surface of each of the substrate plates of silicon carbide, alumina, silicon nitride, ITO glass, fused silica glass and stainless steel without providing a LaNiO$_3$ layer.

Each of the thus formed dielectric PZT layers was inspected for the crystal orientation to find that slight orientation was obtained on the substrate of silicon carbide and silicon nitride but absolutely no orientation was found on the other substrates.

EXAMPLE 2

Figure 2:
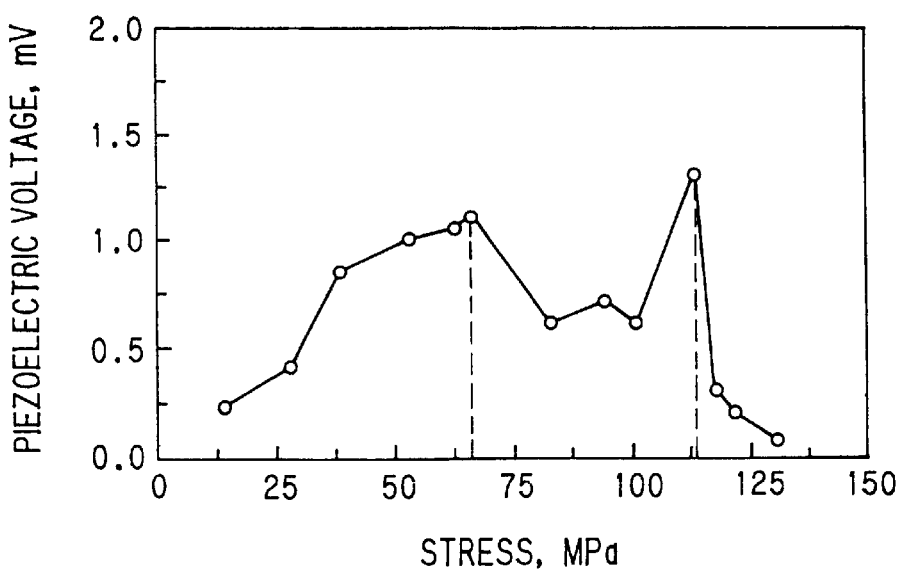

A compressive pressure varied up to 300 MPa was applied to each of the multilayered electronic devices prepared in Example 1 having an electroconductive LaNiO$_3$ layer and a dielectric PZT layer formed on the silicon carbide substrate and the glass substrate to detect piezoelectric voltages. FIGS. 1 and 2 show the thus observed piezoelectric voltages generated in the samples of silicon carbide substrate and glass substrate, respectively, as a function of the compressive pressure.

Figure 3:
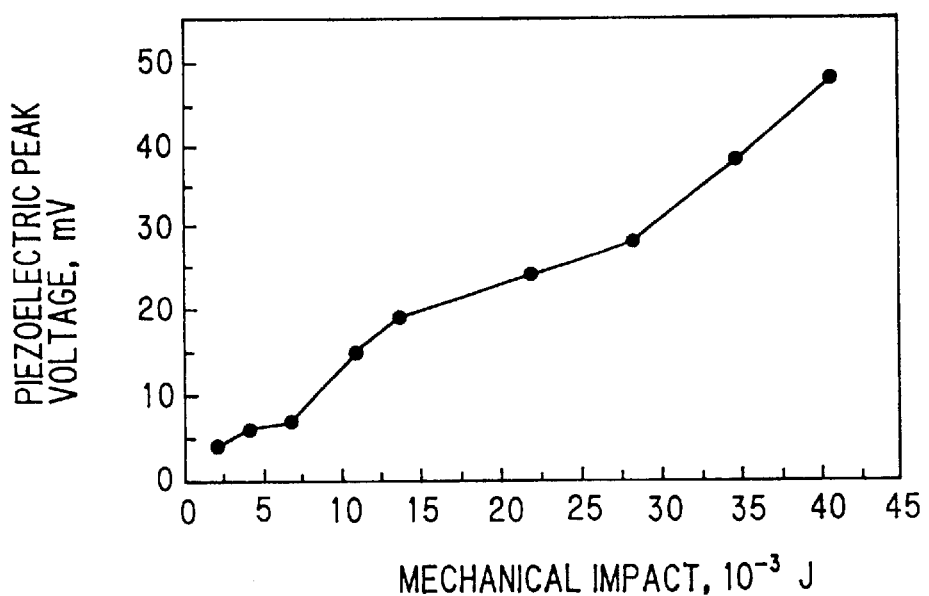
FIGS. 3 and 4 are each a graph showing the piezoelectric peak voltages generated in a $PZT/LaNiO_3/Si_3N_4$ multilayered body and a $PZT/LaNiO_3/SiC$ multilayered body, respectively, tested in Example 2 as a function of the energy of mechanical impact added thereto.
Figure 4:
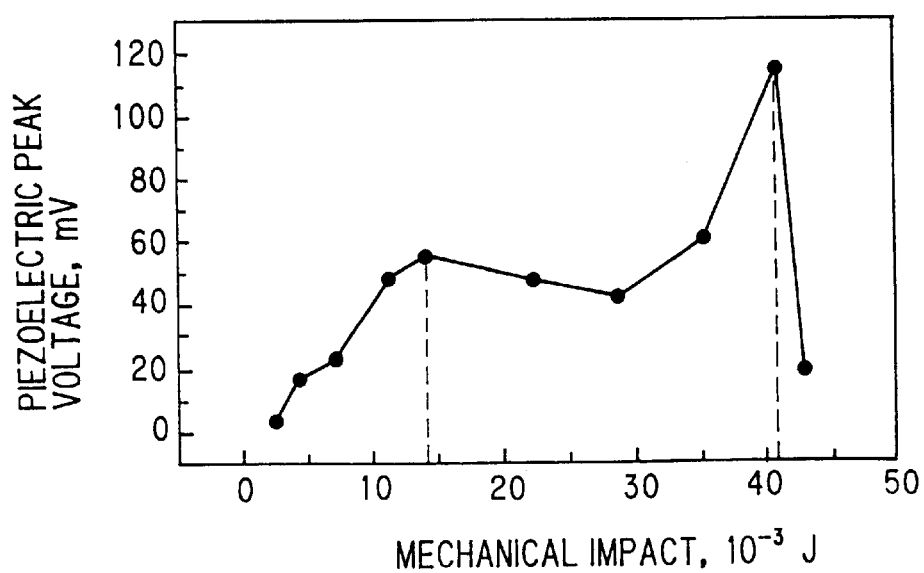

Separately, mechanical impacts with energy varied up to 50×10$^{-3}$ J were added to each of the multilayered electronic devices prepared in Example 1 having an electroconductive LaNiO$_3$ layer and a dielectric PZT layer formed on the silicon nitride substrate and the silicon carbide substrate to detect piezoelectric voltages. FIGS. 3 and 4 show the peak value of the thus observed piezoelectric voltages generated in the samples of silicon nitride substrate and silicon carbide substrate, respectively, as a function of the energy of the mechanical impact.

As is understood from FIGS. 1 and 3, the piezoelectric voltages are increased approximately linearly as the stress or impact energy is increased when the stress or impact energy is still within the elastic region of the substrate material. When the stress or impact energy is further increased to exceed a certain critical value, as is shown in FIGS. 2 and 4, the piezoelectric voltage begins to decrease from the maximum value presumably due to incipient formation of micro-cracks in the substrate material. As the mechanical force is further increased, the piezoelectric voltages turn to again increase gradually reaching a second maximum value where the substrate material is ultimately destroyed. It is presumable that growing propagation of the microcracks in the substrate material proceeds in the range between the first and the second maximum values of the piezoelectric voltage. Accordingly, a continued measurement of the piezoelectric voltages under increasing mechanical force applied to the substrate material gives an indication for occurrence and growth of microcracks finally resulting in destruction of the substrate material.

EXAMPLE 3

Measurements of dielectric constant and dielectric loss were conducted at frequencies varied up to 100 kHz for the multilayered electronic device prepared in Example 1 having a electroconductive layer of LaNiO$_3$ and a dielectric PZT layer on the optical glass substrate by providing an upper electrode of platinum. The results are shown by the solid line curves in FIG. 5, of which the upper curve is for the dielectric constant (left ordinate) and the lower curve is for the dielectric loss (right ordinate), as a function of the frequency.

For comparison, the same measurements as above were conducted for a conventional multilayered device having an ITO layer as the electroconductive layer in place of the LaNiO$_3$ layer. The results are shown by the dotted line curves in FIG. 5, of which the upper curve is for the dielectric constant (left ordinate) and the lower curve is for the dielectric loss (right ordinate), as a function of the frequency.

Figure 5:
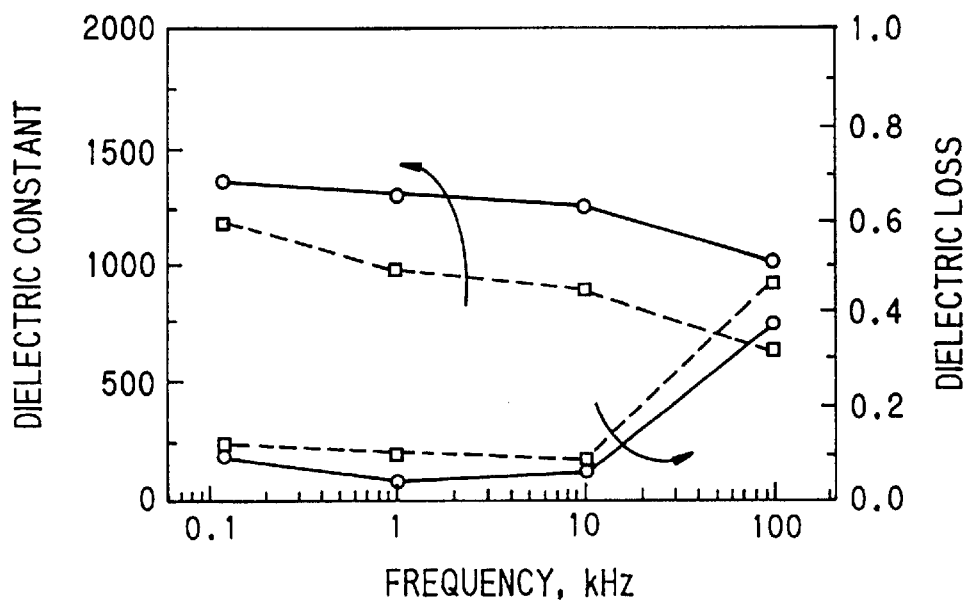
FIG. 5 is a graph showing the dielectric constant and dielectric loss of the $PZT/LaNiO_3$/glass multilayered body prepared in Example 3 (solid lines) and of a conventional PZT/ITO/glass multilayered body (dotted lines) as a function of the frequency.

As is understood from FIG. 5, the multilayered device of the invention having an electroconductive LaNiO$_3$ layer exhibits greatly improved ferroelectric characteristics as compared with the conventional device having an electroconductive ITO layer.

EXAMPLE 4

Measurements were conducted for the hysteresis behavior of dielectric polarization in the inventive multilayered device on an optical glass substrate as used in Example 3. The results are shown in FIG. 6 by the hysteresis loop I.

For comparison, the same measurements as above were conducted for the comparative device having an electroconductive ITO layer as used in Example 3. The results are shown also in FIG. 6 by the hysteresis loop II.

Figure 6:
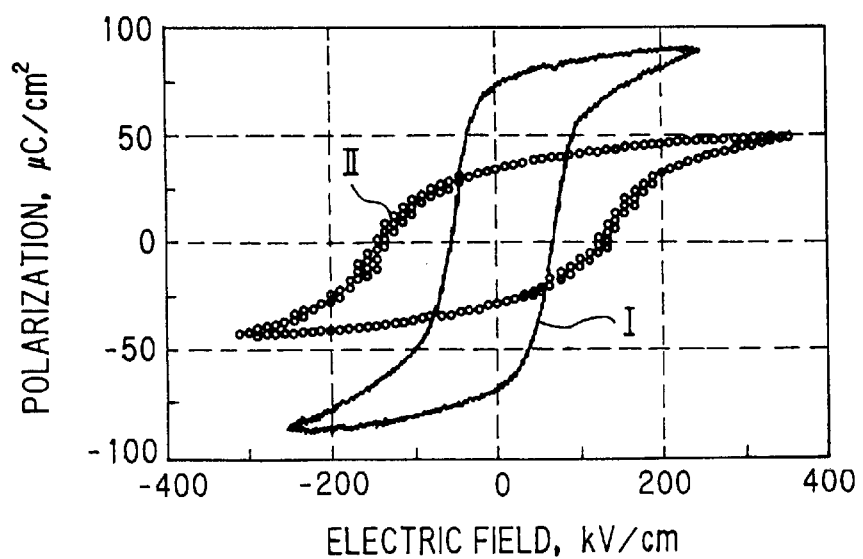
FIG. 6 is a graph showing the hysteresis curves of the electric polarization (ordinate) under varied electric fields in the $PZT/LaNiO_3$/glass multilayered body prepared in Example 4 (loop I) and in a conventional PZT/ITO/glass multilayered body (loop II) taking the electric field as the abscissa.

The results shown in FIG. 6 suggest that the multilayered device of the invention would be useful as a memory device with good switching characteristics by virtue of the unique ferroelectric properties.

In addition to the application as a ferroelectric memory device as suggested by the above described hysteresis behavior, the inventive PZT/LaNiO$_3$/substrate device has, by virtue of the good transparency of the LaNiO$_3$ layer, a further possibility of application as an optical memory device when the substrate material is a transparent material such as glass to form a PZT/LaNiO$_3$/glass system.

EXAMPLE 5

The multilayered device prepared in Example 1 having an electroconductive layer of LaNiO$_3$ and a dielectric PZT layer on an optical glass substrate was further provided with a second electroconductive layer of LaNiO$_3$ to serve as an upper electrode and was subjected to the measurement of fatigue in the polarization after application of varied electric fields repeated up to 10$^{11}$ cycles. The results are shown in FIG. 7 by the curve I normalized taking the initial value as 1.0 as a function of the number of the repeated cycles of electric field application.

For comparison, the same fatigue measurement as above was undertaken for a conventional multilayered device having a dielectric PZT layer sandwiched between lower and upper electrode layers of platinum on a semiconductor silicon substrate. The results are shown also in FIG. 7 by the curve II.

Figure 7:
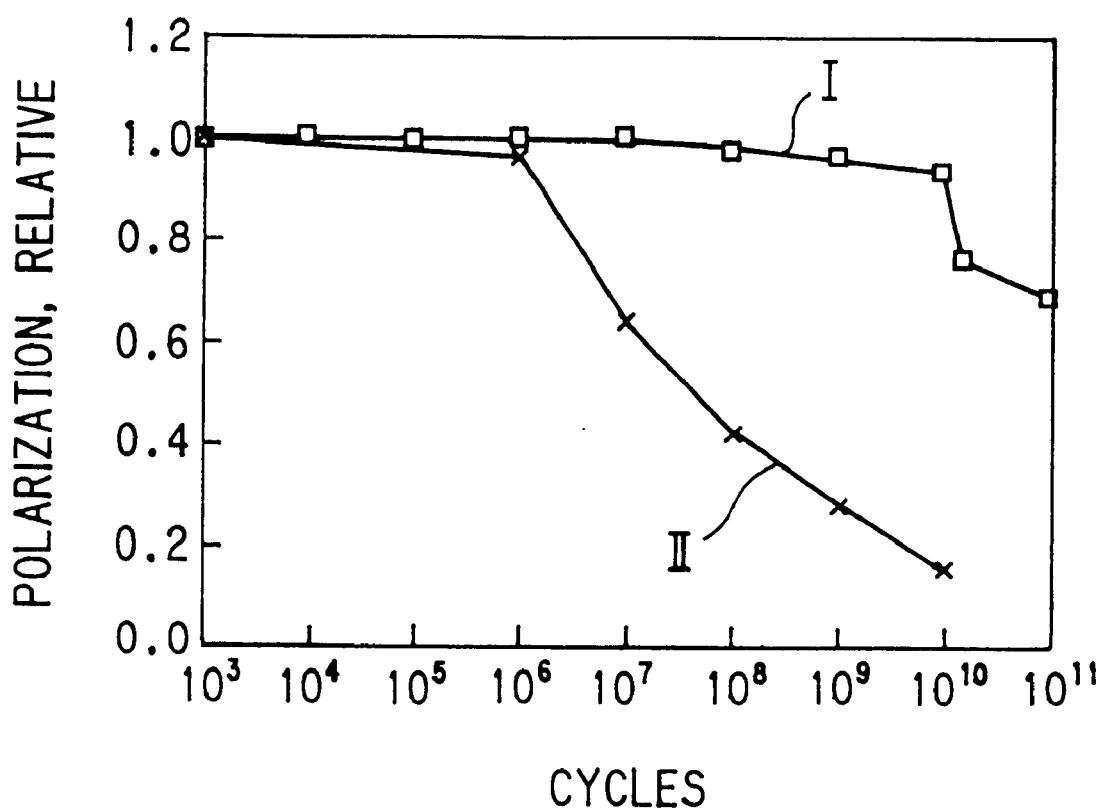
FIG. 7 is a semilogarithmic graph showing decay of the polarization (ordinate) by fatigue in the $PZT/LaNiO_3$/glass multilayered body prepared in Example 5 (curve I) and in a conventional PZT/Pt/Si multilayered body (curve II) taking the number of cycles as the abscissa.
Figure 8:
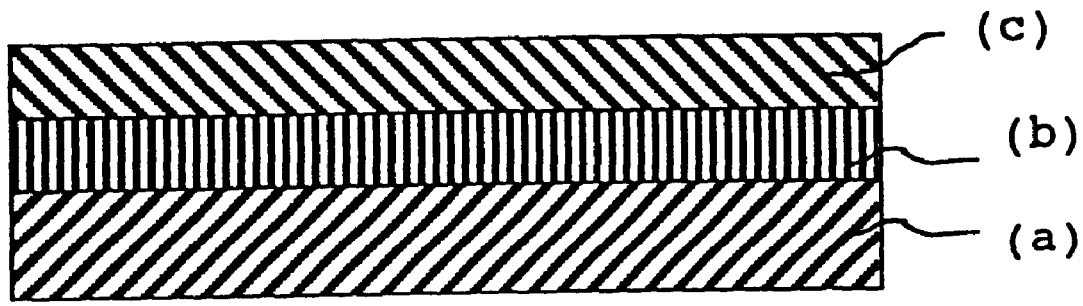
FIG. 8 depicts the vertical cross-section of the three-layered electronic device of the present invention.

As is understood from the results shown in FIG. 7, the multilayered device of the invention exhibits a great improvement in the performance as a memory device showing little fatigue in the dielectric polarization as compared with the conventional similar devices.

What is claimed is:

1. A multilayered electronic device which comprises:
   (a) a substrate which is formed from a ceramic material or a glassy material;
   (b) a layer of an electroconductive polycrystalline material having a perovskite structure formed on the surface of the substrate; and
   (c) a layer of a dielectric crystalline material having an oriented perovskite structure formed on the electrocoductive layer (b).

2. The multilayered electronic device as claimed in claim 1 in which the electroconductive polycrystalline material forming the layer (b) is a lanthanum nickel oxide of the formula $LaNiO_3$.

3. The multilayered electronic device as claimed in claim 1 in which the dielectric crystalline material forming the layer (c) is lead zirconate titanate.

4. The multilayered electronic device as claimed in claim 1 in which the substrate is formed from a ceramic material.

5. The multilayered electronic device as claimed in claim 1 in which the substrate is formed from a metallic material.

6. The multilayered electronic-device as claimed in claim 1 in which the substrate is formed from an amorphous material.

7. The multilayered electronic device as claimed in claim 6 in which the amorphous material is a glassy material.

8. The multilayered electronic device as claimed in claim 1 in which the electroconductive layer (b) has a thickness of at least 10 nm.

* * * * *